United States Patent
Ng et al.

(10) Patent No.: US 12,418,976 B2
(45) Date of Patent: Sep. 16, 2025

(54) SYSTEM, PROCESS AND A JIG FOR FORMING CONFORMAL EMI SHIELD ON PACKAGE-LEVEL ELECTRONICS OR A PORTION THEREOF

(71) Applicant: Inari Technology Sdn Bhd, Bayan Lepas (MY)

(72) Inventors: Boon Siew Ng, Sungai Petani (MY); Soon Kiang Tan, Bayan Lepas (MY); Eng Soon Loh, Ayer Itam (MY)

(73) Assignee: Inari Technology Sdn Bhd, Bayan Lepas (MY)

( * ) Notice: Subject to any disclaimer, the term of this patent is extended or adjusted under 35 U.S.C. 154(b) by 218 days.

(21) Appl. No.: 17/828,280

(22) Filed: May 31, 2022

(65) Prior Publication Data

US 2022/0386450 A1    Dec. 1, 2022

(30) Foreign Application Priority Data

May 31, 2021   (MY) .............................. PI2021003026

(51) Int. Cl.
*H01J 37/32* (2006.01)
*C23C 14/34* (2006.01)
(Continued)

(52) U.S. Cl.
CPC ........... *H05K 1/0216* (2013.01); *C23C 14/34* (2013.01); *C23C 14/50* (2013.01);
(Continued)

(58) Field of Classification Search
CPC ......... C23C 14/50; C23C 14/35; C23C 14/34; B23K 37/0417; B23K 37/0443;
(Continued)

(56) References Cited

U.S. PATENT DOCUMENTS

| 7,964,938 B2 | 6/2011 | Yoon et al. |
| 2009/0229971 A1* | 9/2009 | Ishihara ................ C23C 14/541 |
| | | 204/298.07 |

FOREIGN PATENT DOCUMENTS

| CN | 103576602 | 2/2014 |
| CN | 110047826 | 7/2019 |

(Continued)

OTHER PUBLICATIONS

English Abstract of CN 110047826.
English Abstract of CN 103576602.

*Primary Examiner* — Tyrone V Hall, Jr.
(74) *Attorney, Agent, or Firm* — Preston Smirman; SMIRMAN IP LAW, PLLC

(57) ABSTRACT

A system for forming a conformal electromagnetic interference shield on at least one singulated electronic package (300), including a tray preparation module that prepares a tray (200) by mounting an electromagnetic interference tape (202) onto a frame (201), with the electromagnetic interference tape (202) covering the entirety of the frame (201), a pick and place module for placing at least one singulated electronic packages (300) onto the tray (200), a jig (100) for supporting the tray (200) having the singulated electronic packages (300), and a sputtering machine that forms a conformal electromagnetic interference shield onto the singulated electronic packages (300) through a sputtering process. The jig (100) includes a body having an arcuate surface (101), wherein the arcuate surface (101) of the jig (100) allows substantially continuous contact between the jig (100) and the electronic package (300).

9 Claims, 4 Drawing Sheets

(51) Int. Cl.
*C23C 14/50* (2006.01)
*H05K 1/02* (2006.01)
*H05K 1/09* (2006.01)
*H05K 3/16* (2006.01)

(52) U.S. Cl.
CPC .......... *H01J 37/32715* (2013.01); *H05K 1/09* (2013.01); *H05K 3/16* (2013.01); *H05K 2203/0173* (2013.01)

(58) Field of Classification Search
CPC B23Q 3/08; B25B 11/00; B25B 11/02; B25B 11/002; H01J 37/32715
See application file for complete search history.

(56) References Cited

FOREIGN PATENT DOCUMENTS

| | | | | | |
|---|---|---|---|---|---|
| CN | 110724925 | A | * | 1/2020 | ............. C23C 14/35 |
| JP | 2015109416 | A | * | 6/2015 | |
| WO | WO-2017030315 | A1 | * | 2/2017 | ............. C23C 14/04 |
| WO | WO-2018199507 | A1 | * | 11/2018 | ............. C23C 14/34 |

* cited by examiner

SYSTEM, PROCESS AND A JIG FOR FORMING CONFORMAL EMI SHIELD ON PACKAGE-LEVEL ELECTRONICS OR A PORTION THEREOF

CROSS-REFERENCE TO RELATED APPLICATION

The instant application claims priority to Malaysia Patent Application Serial No. PI2021003026 filed May 31, 2021, the entire specification of which is expressly incorporated herein by reference.

FIELD OF THE INVENTION

The invention relates to the formation of a conformal electromagnetic interference shield on package-level electronics. More particularly, the invention relates to a system and process having a jig that facilitates this formation.

BACKGROUND OF THE INVENTION

Electromagnetic Interference (EMI) refers to a natural phenomenon where electromagnetic radiation interferes with the intended operation of electronic circuitry through electromagnetic induction, electrostatic coupling, or conduction. Current trends for electronic circuitry are becoming more advanced, with them having higher clock frequencies and fast edge rates in a form of a miniaturized electronic package. However, such packages emit some form of electromagnetic radiation and inevitably become a source of man-made electronic interference. In a densely packed printed circuit board (PCB) having multiple electronic packages of different functionalities, there will be electromagnetic interference due to the interactions between each of the electronic packages, which leads to faults in circuit board's intended operation.

Rudimentary methods to resolve the electromagnetic interference between each of the electronic packages typically involve the use of an external shield housing, that covers the electronic packages to prevent it from emitting or being affected by electromagnetic radiation based on the concepts of the Faraday Cage. Even so, the inclusion of external shield housing on a PCB makes it bulkier and heavier, making it an unviable EMI shielding option for PCBs with a small form factor.

To resolve this problem, instead of an external shielding box, the encapsulation mould portions of an electronic package is coated with one or more layers of conductive metal referred to as a conformal EMI shield. This is done through physical vapor deposition that can be carried out through a sputtering process. In the sputtering process, a target material (which is the aforementioned conductive metal) is bombarded with energetic ions that cause the atoms of the target material to be "knocked off". These freed atoms from the target material then travel to the electronic package and are deposited at its encapsulation mould portions. The sputtering process provides a uniform layer of deposited metal, while also having a high rate of scalability.

However, when the target material is being deposited on the electronic package, due to the conversion from kinetic energy to thermal energy, the electronic package itself may experience heating. If this heat is not properly dissipated during the sputtering process, it may lead to outgassing that deforms the formation of the conformal EMI shield, or worse, may lead to failure of the electronic component due to its thermal tolerance being exceeded. Therefore, there is a need for a solution, preferably in the form of an apparatus included during the formation of the conformal EMI shield that resolves this problem of thermal management during the sputtering process.

There are a few patented technologies over the prior art relates to the formation of a conformal EMI shield on an electronic package. Among them is CN110047826A, which discloses provides a kind of semiconductor package and its manufacturing methods that includes shielding multiple sides of the package. It also discloses a kind of jig for supporting the packages and facilitates the process of applying a conformal EMI shield on an electronic package, which includes the sputtering process. The jig covers the contacts of the semiconductor package so that they do not get sputtered with the EMI shield layer.

Another such patented technology is U.S. Pat. No. 7,964,938B2, which discloses the manufacture of a semiconductor package having a function of shielding EMI that includes a jig. The jig is used in a plasma sputtering, wherein a nickel alloy is coated on the surface of a semiconductor package by a sputtering method to form a conformal EMI shield.

Yet another patented technology is CN103576602 (A), which discloses a kind of jig for applying a conformal EMI shield on an electronic package. The jig has two parts, a frame for securing the electronic package and a base. The formation of a conformal EMI shield is done through sputtering.

While the aforementioned prior art relates to the formation of a conformal EMI shield on an electronic package, they fail to disclose means to address the problem of thermal management during the sputtering process. Accordingly, it would be desirable to have a system and process for the formation of a conformal EMI shield on an electronic package that includes a jig that facilitates this formation by providing thermal management during the sputtering process.

SUMMARY OF THE INVENTION

The main objective of the invention is to provide an apparatus that facilitates thermal management during the sputtering process for forming an electronic interference (EMI) shield. To achieve this objective, there is a jig having an arcuate surface and having one or more securing means. Prior to the sputtering process, the electronic packages are laid on a tray. This tray would then be secured on top of the jig through the securing means. The combinative configuration of the arcuate surface and the securing means ensures continuous contact between the electronic packages and the jig so that heat can be dissipated from the electronic packages to the jig during the sputtering process.

Advantageously, the continuous contact between the electronic packages and the jig reduces the occurrence of outgassing during the sputtering process, and this ensures consistent sputtered deposition of the conformal EMI shield. Moreover, as this continuous contact also allows for heat dissipation, the thermal tolerance of the electronic components will not be exceeded, and therefore this reduces failure of the electronic components due to poor thermal management during the sputtering process.

The invention intends to provide a jig for supporting at least one singulated electronic package during a sputtering process where a conformal electromagnetic interference shield is formed on the singulated electronic packages, the jig comprising a body having an arcuate surface on which the singulated electronic packages are received. The arcuate surface allows substantially continuous contact between the jig and the singulated electronic package.

Preferably, the jig further comprises securing means to hold the singulated electronic package on the arcuate surface, the securing means including a plurality of embedded magnets located adjacent to the body of the jig. Preferably as well, the arcuate surface of the jig is a raised paraboloid.

The invention also intends to provide a system, for forming a conformal electromagnetic interference shield on at least one singulated electronic package, comprising a tray preparation module that prepares a tray by mounting an electromagnetic interference tape onto a frame, with the electromagnetic interference tape covering the entirety of the frame, a pick and place module for placing at least one singulated electronic packages onto the tray, a jig for supporting the tray having the singulated electronic packages that comprises a body having an arcuate surface, and a sputtering machine that forms a conformal electromagnetic interference shield on the singulated electronic packages through a sputtering process. The arcuate surface of the jig allows substantially continuous contact between the jig and the singulated electronic package.

Preferably, the jig of the system further comprises a securing means is provided to hold the tray that has the singulated electronic packages on the arcuate surface, the securing means comprising a plurality of embedded magnets located adjacent to the body of the jig.

Preferably, the system further comprises a pre-tape mounting module for laminating a pre-tape to cover the exposed contacts of a pre-singulated electronic package.

Preferably, the pick and place module of the system places the singulated electronic packages on the tray with the pre-tape of the singulated electronic packages in contact with the electromagnetic interference tape.

Preferably, the system further comprises a pressure roller module that firmly secures the singulated electronic packages on the tray by applying pressure across the x-direction and the y-direction.

Preferably, the system further comprises a robot arm that passes the tray from the pick and place module onto the jig, passes the jig together with the tray into and out from the sputtering machine, or a combination thereof.

The invention also intends to provide a method, for forming a conformal electromagnetic interference shield on at least one singulated electronic package comprising the steps of preparing a tray by mounting an electromagnetic interference tape onto a frame, disposing at least one singulated electronic packages onto the tray, supporting the tray using a jig having an arcuate surface; and forming a conformal electromagnetic interference shield on at least one singulated electronic package on the tray through a sputtering process. The arcuate surface of the jig allows substantially continuous contact between the jig and the singulated electronic package.

Preferably, the method further comprises the step of securing the singulated electronic packages on the tray by applying pressure across the x-direction and the y-direction, using a pressure roller module.

Preferably, the method further comprises the step of detaching the singulated electronic packages from the tray after the completion of the sputtering process.

One skilled in the art will readily appreciate that the invention is well adapted to carry out the objects and obtain the ends and advantages mentioned, as well as those inherent therein. The embodiments described herein are not intended as limitations on the scope of the invention.

BRIEF DESCRIPTION OF THE DRAWINGS

To facilitate an understanding of the invention, there is illustrated in the accompanying drawing the preferred embodiments from an inspection of which when considered in connection with the following description, the invention, its construction and operation and many of its advantages would be readily understood and appreciated.

DETAILED DESCRIPTION OF THE INVENTION

The present invention relates to the formation of a conformal electromagnetic interference (EMI) shield on package-level electronics. More particularly, the invention relates to a system and process having a jig that facilitates this formation. The invention may also be presented in a number of different embodiments with common elements. According to the concept of the invention, the jig comprises a body having an arcuate surface with one or more securing means.

The invention will now be described in greater detail, by way of example, with reference to the drawings.

Figure 1:
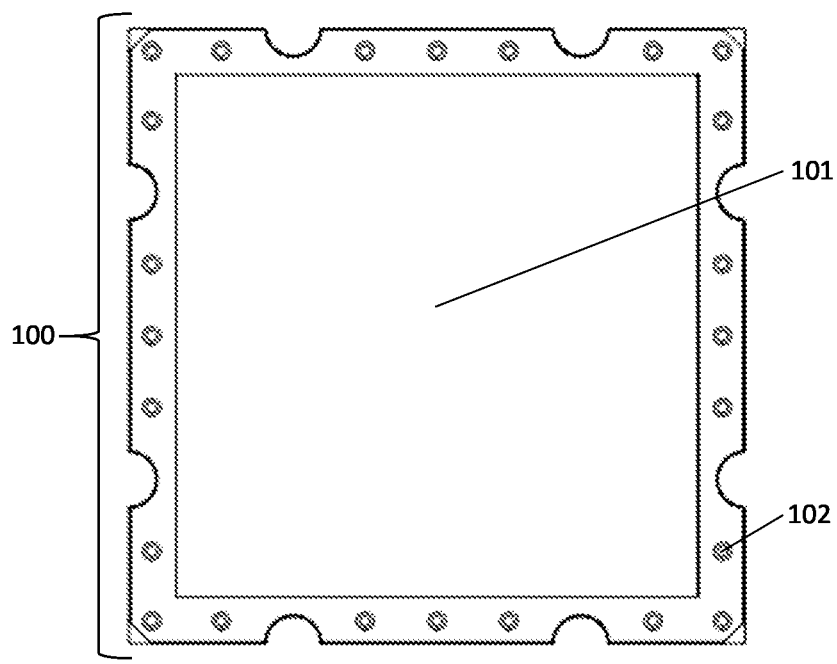
FIG. 1 is a diagram illustrating the top view of the jig of the present invention.
Figure 2A:
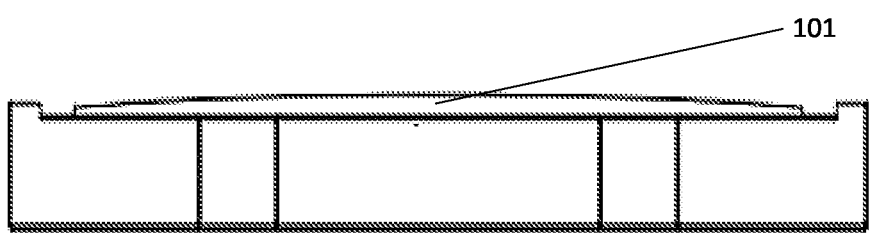
FIG. 2a is a diagram illustrating a side view of the jig of the present invention when viewed from the top or bottom.
Figure 2B:
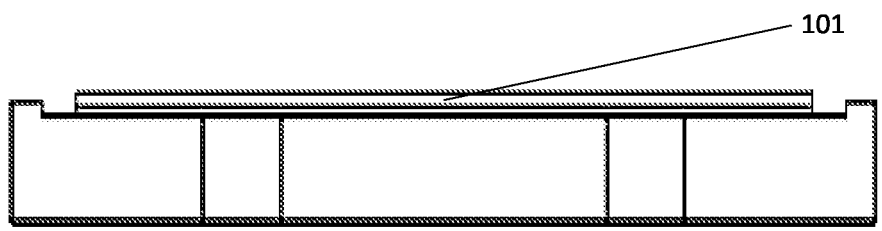
FIG. 2b is a diagram illustrating a side view of the jig of the present invention when viewed from the left or right.
Figure 3A:
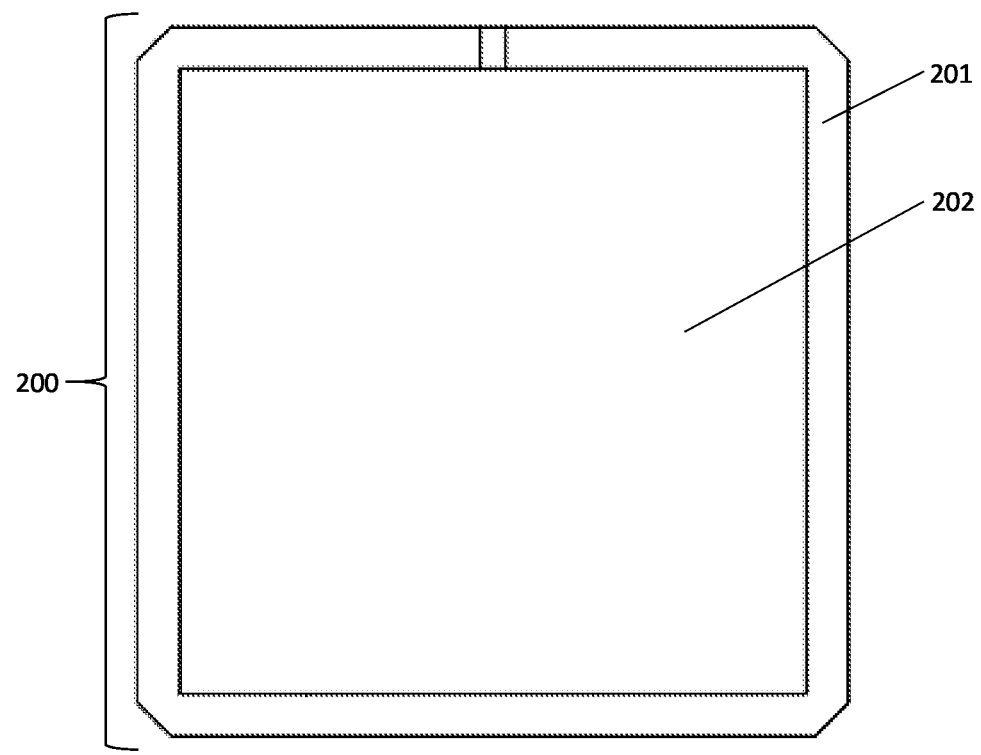
FIG. 3a is a diagram illustrating tray where the electronic packages will be laid upon.
Figure 3B:
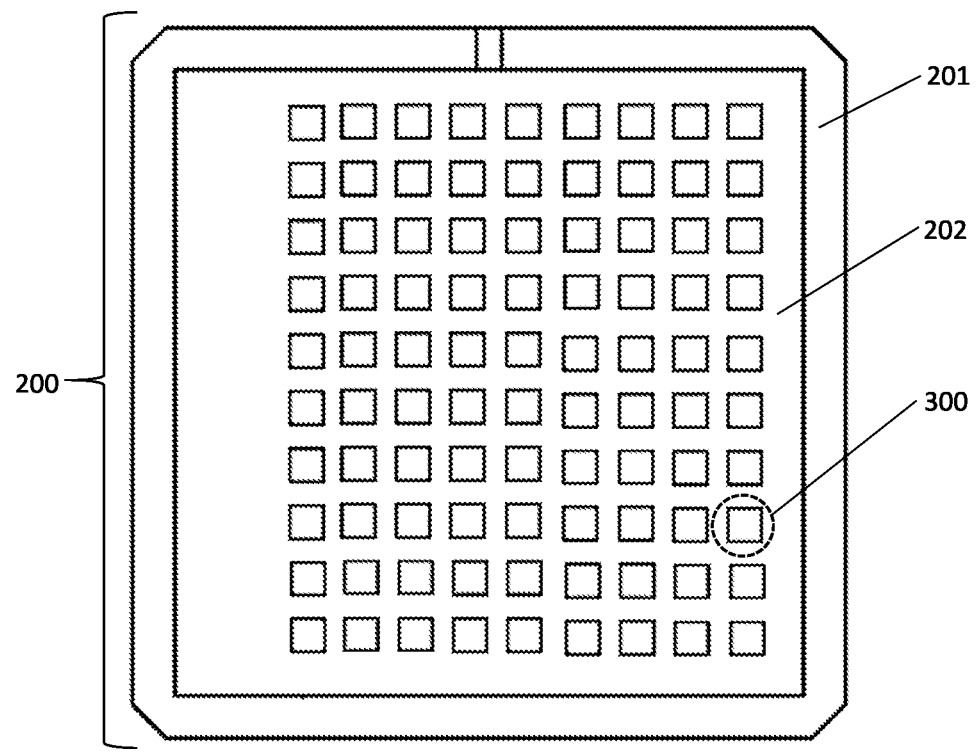
FIG. 3b is a diagram illustrating tray where the electronic packages laid upon.

FIG. 1 illustrates the top view of the jig 100 of the present invention to be used in the sputtering process. FIG. 2a and FIG. 2b both illustrate the side views of the jig 100, which shows its arcuate surface 101. FIG. 3a illustrates the tray 200, while FIG. 3b illustrates it with one or more singulated electronic packages 300 are laid upon prior to the sputtering process. The singulated electronic packages 300 in this context refers to Surface Mount Technologies (SMT) such as, but will not be limited to, Land Grid Array (LGA) packages, Ball Grid Array (BGA) packages and the likes. Fundamentally, each of these singulated electronic packages 300 have at least an encapsulation mould or an insulation layer that protects the integrated circuitry within it.

In the present embodiment of the invention, the singulated electronic packages 300 originate from a wafer-level packaging process flow. In such a process, a silicon wafer containing the integrated circuitry of the electronic packages is packaged using an encapsulation mould prior to dicing. Preferably, after the silicon wafer is packaged with the encapsulation mould, it is mounted in its entirety with a pre-tape to seal its metal contacts. This is to prevent the contacts from being exposed to sputter material or be contaminated by the back spill of sputter material during the sputtering process later. The pre-tape 301 is mounted using a pre-tape mounting module, and is preferably comprised of a Polyethylene Terephthalate (PET) release liner layer, a heat-activated adhesive layer and a polyimide film layer. Upon mounting of the pre-tape 301, the dicing process is done so that at least one singulated electronic package 300 is produced.

The tray 200, shown in FIG. 3a, comprises a frame 201, preferably made of ferromagnetic material, and is shaped similarly to a quadrilateral annulus. One surface of the frame 201 is taped entirely with EMI tape 202. The adhesive portion of the EMI tape 202 is exposed on the other surface through the hole of the frame 201, thus forming the tray 200. The EMI tape 202 preferably comprises a PET release liner layer, a silicon adhesive layer and a polyimide film layer. The tray 200 is then loaded with the electronic packages 300 using a pick-and-place machine. The pick-and-place machine picks each of the singulated electronic packages 300, flips it, and places them on the tray 200. This is so that the encapsulation mould of the electronic package 300 faces upwards, while the pre-tape 301 layer on the electronic package 300 faces downwards to be adjacent to the EMI tape 202. This results in the loaded tray 200 as per FIG. 3b.

As shown in FIG. 1, FIG. 2a and FIG. 2b, the jig 100 preferably has a cuboidal body having an arcuate surface 101. Additionally, the jig 100 may further comprise a plurality of embedded magnets 102 that are the securing means for securing the loaded tray 200 when it is mounted on top of the jig 100. These embedded magnets 102 are located adjacent away from the sides of the jig 100. When the loaded tray 200 is mounted on top, the frame 201 of the loaded tray 200 is vertically adjacent to the embedded magnets 102. Hence, the embedded magnets 102 will magnetically attract the frame 201 of the tray 200 so that the tray 200 is secured in place on the jig 100. The means to secure the loaded tray 200 on the jig 100 need not be limited to the use of magnets. Other devices such as clamps may also be used, wherein it clamps the frame 201 of the tray 200 to the jig 100 to secure it in position. Finally, the cylindrical indented portions on the sides of the jig 100 as seen in FIG. 1, FIG. 2a and FIG. 2b facilitate the transport of the jig 100 to and fro the sputtering chamber, preferably by using a robot arm.

Figure 4:
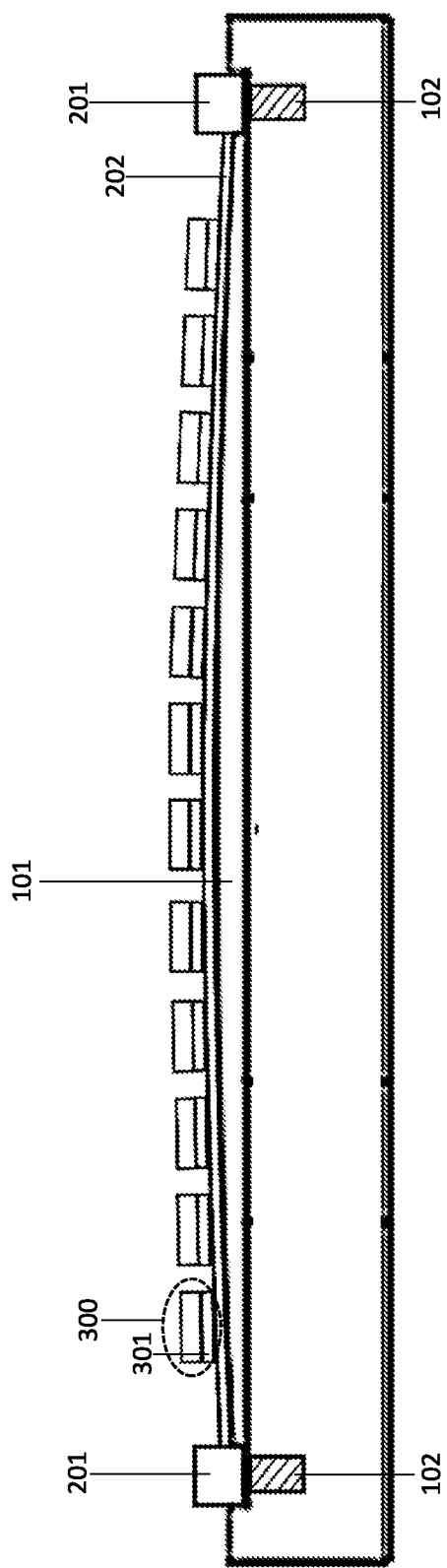
FIG. 4 is a diagram illustrating the cross-sectional view of the instance where the tray is placed on top of the jig.

FIG. 4 illustrates the result when the loaded tray 200, having the singulated electronic components 300, is placed on the jig 100. Presenting FIG. 4 in a cross-sectional manner properly shows the intended outcome from this combinative configuration. As seen, the frame 201 of the tray 200 is secured in place by the embedded magnets 102 of the jig 100 through magnetic attraction. By doing so, the EMI tape 202 portion of the tray 200 is slightly stretched and it bulges upwards due to the arcuate surface 101 of the jig 100, which is preferably the shape of a raised paraboloid. As a result, continuous contact is formed between each of the electronic packages 300 and the jig 100. During the sputtering process for the formation of the EMI conformal shield, sputter material is deposited onto the encapsulation mould portion of the electronic package 300. Thermal energy produced from this process is dissipated from the electronic package 300 to the jig 100. The thermal dissipation is further enhanced by the polyimide film present in both the pre-tape 301 and EMI tape 202 as it is a good thermal conductor. Thus, thermal energy is transferred away from the electronic package 300 through conduction.

It should be noted that the body of the jig 100 need not be cuboidal, and the tray 200 also need not be in the shape of a quadrilateral as seen in the FIG. 1 to FIG. 3b. Alternatively, the body of the jig 100 may be cylindrical, and the tray 200 may be circular in shape by having the frame 201 to be in the shape of an annulus. Moreover, the arcuate surface 101 of the jig 100 need not be limited to a paraboloid, and ideally can be any form of extruded surface that will make the EMI tape 202 bulge upwards in a taut manner as seen in FIG. 4 when the tray 200 loaded with the electronic packages 300 is placed on the jig 100. Additionally, the layers of the pre-tape 301 and EMI tape 202 used need not be limited to what has been described previously, and may be comprised of other type of tapes with good thermal conductivity properties such as Kapton tape, Upilex® or the likes.

Figure 5:
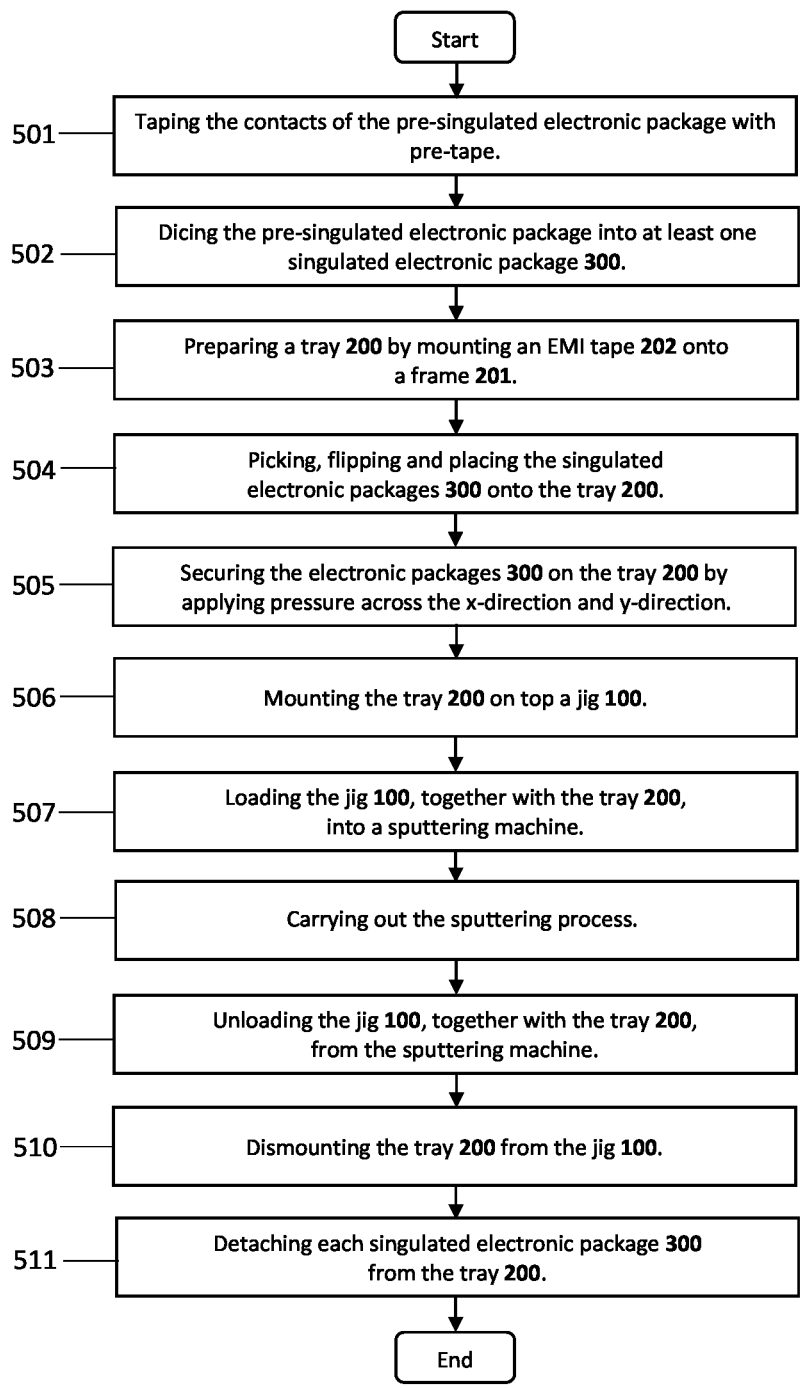
FIG. 5 is a diagram illustrating the process flow chart where an EMI conformal shield is formed on one or more electronic packages.

The process flow chart where an EMI conformal shield is formed on one or more electronic packages 300 using the jig 100 is illustrated in FIG. 5.

The process flow chart starts with step 501, which is part of the wafer-level packaging process, wherein the encapsulation mould has been formed on top of the wafer to form the pre-singulated electronic package. The metal contacts of the pre-singulated electronic package are covered by taping them with pre-tape 301. Following this, in step 502, the pre-singulated electronic package goes through a dicing process so that it becomes a plurality of singulated electronic packages 300. With this, the steps that cover the wafer-level packaging process portion are completed.

The tray 200 is then prepared in step 503. The preparation of the tray 200 follows similarly with what was described above, with a frame 201 being taped with EMI tape 202. Upon the completing the tray 200, the following step, step 504, is done, where the singulated electronic packages 300 are individually picked up, flipped and laid upon the tray 200 using a pick and place machine. Flipping of the singulated electronic packages 300 is required so that the encapsulation mould of the electronic package 300 faces upwards, while the pre-tape 301 layer on the electronic package 300 faces downwards to be adjacent to the EMI tape 202. This results in the loaded tray 200 as previously seen in FIG. 3b.

Following this, step 505 is done where the singulated electronic packages 300 are secured on the tray 200 using a pressure roller module. The pressure roller module applies pressure across the x-direction and the y-direction of the loaded tray 200. This may be done through rotating the tray 200 by 90°, after the first roll, or by rotating the roller by 90° after the first roll. After this, the loaded tray 200 is now ready to be placed on the jig 100 to undergo the sputtering process.

As the loaded tray 200 is placed on the jig 100 as per step 506, they become configuratively similar to what was shown in FIG. 4. The next step would be step 507, where the loaded tray 200 and the jig 100 are loaded into the chamber of a sputtering machine, for the sputtering process of step 508. During step 508, preferably, 3 layers of metal are deposited onto the encapsulation mould of each singulated electronic package 300 to form the conformal EMI shield. These layers correspond to the conventional SuS-CU-SuS layer buildup, with the first seed layer being the stainless steel, the second bulk layer being pure copper, and the final finisher layer being stainless steel. During the sputtering process of step 508, the electronic packages 300 may be heated up to due to the metal layers being deposited of the on them. The continuous contact between the electronic package 300 and jig 100 will contribute in dissipating this heat, or thermal energy, away from the electronic package 300 to jig 100 through conduction, thus ensuring the temperature of the electronic packages 300 stays within the limits of thermal tolerance. This also reduces the occurrence of outgassing, which may deform the conformal EMI shield layer that is being formed on the encapsulation mould portion of the electronic package 300.

Upon the completion of the sputtering process, the jig 100 together with the tray 200 are unloaded from the sputtering chamber as per step 509, and is left in room temperature to cool down. After that would be step 510, where the loaded tray 200, containing the electronic packages 300, is detached from the jig 100, and the jig 100 can then be reused for the following incoming loaded trays 200. The final step is step 511, where the electronic packages 300, now having the conformal EMI shield layer, are then removed from the loaded tray 200 for a further quality inspection process. The EMI tape 202 is disposed of so the electronic packages 300 may be removed. With this, the formation of a conformal EMI shield on the electronic packages 300 is described completely.

Ultimately, the inclusion of the jig 100 in the system and method for the formation of conformal EMI shielding ensures continuous contact between the electronic packages 300 and the jig 100. Thus, this reduces the occurrence of outgassing during the sputtering process to ensure consistent sputtered deposition of the conformal EMI shield. Moreover, as this continuous contact also allows for heat dissipation, the thermal tolerance of the electronic packages 300 will not be exceeded, and therefore this reduces failure of the electronic packages 300 due to poor thermal management during the sputtering process.

The present disclosure includes as contained in the appended claims, as well as that of the foregoing description. Although this invention has been described in its preferred form with a degree of particularity, it is understood that the present disclosure of the preferred form has been made only by way of example and that numerous changes in the details of construction and the combination and arrangements of parts may be resorted to without departing from the scope of the invention.

What is claimed is:

1. A system for forming a conformal electromagnetic interference shield on at least one singulated electronic package through a sputtering process, comprising:
   a jig;
   wherein the jig is configured to support a tray;
   wherein the tray is a frame formed with a hole and is mounted with an electromagnetic interference tape, with singulated electronic packages placed within the frame on the electromagnetic interference tape;
   wherein the electromagnetic interference tape includes one thermal conductor layer;
   wherein each of the singulated electronic packages includes a pre-tape layer that includes one thermal conductor layer;
   wherein the singulated electronic packages are placed on the electromagnetic interference tape such that the pre-tape layer of each singulated electronic package is adjacent to the electromagnetic interference tape;
   wherein the jig comprises:
      a body having an outwardly extending arcuate top surface on which the tray with the singulated electronic packages is received, wherein the top surface is a raised paraboloid; and
      a plurality of magnets;
   wherein the magnets of the jig are each located adjacently with respect to sides of the jig but absent underneath the arcuate surface of the jig; and
   wherein the frame of the tray is attracted to the magnets of the jig in which the frame is secured to the magnets in a vertically adjacent manner, while doing so, the electromagnetic interference tape conforms to the arcuate surface of the jig in a taut manner, for continuous contact between the jig and the singulated electronic packages on the tray, so that heat is dissipated from the singulated electronic packages to the jig during the sputtering process through the thermal conductor layers of the electromagnetic interference tape and the singulated electronic packages.

2. The system according to claim 1, wherein the arcuate surface is a raised paraboloid.

3. A system for forming a conformal electromagnetic interference shield on at least one singulated electronic package through a sputtering process, comprising:
   a tray being a frame formed with a hole and is mounted with an electromagnetic interference tape, with singulated electronic packages placed within the frame on the electromagnetic interference tape; and
   a jig for supporting the tray, the jig comprising:
      a body having an outwardly extending arcuate top surface on which the tray with the singulated electronic packages is received, wherein the top surface is a raised paraboloid; and
      a plurality of magnets;
   wherein the conformal electromagnetic interference shield is formed onto the singulated electronic packages on the tray through the sputtering process;
   wherein the electromagnetic interference tape includes one thermal conductor layer;
   wherein each of the singulated electronic packages includes a pre-tape layer that includes one thermal conductor layer;
   wherein the singulated electronic packages are placed on the electromagnetic interference tape such that the pre-tape layer of each singulated electronic package is adjacent to the electromagnetic interference tape;
   wherein the magnets of the jig are each located adjacently with respect to sides of the jig but absent underneath the arcuate surface of the jig; and
   wherein the frame of the tray is attracted to the magnets of the jig in which the frame is secured to the magnets in a vertically adjacent manner, while doing so, the electromagnetic interference tape conforms to the arcuate surface of the jig in a taut manner, for continuous contact between the jig and the singulated electronic packages on the tray, so that heat is dissipated from the singulated electronic packages to the jig during the sputtering process through the thermal conductor layers of the electromagnetic interference tape and the singulated electronic packages.

4. The system according to claim 3, wherein a pre-tape covers the exposed contacts of a pre-singulated electronic package.

5. The system according to claim 4, wherein the singulated electronic packages are placed on the tray with the pre-tape of the singulated electronic packages in contact with the electromagnetic interference tape.

6. The system according to claim 3, wherein the singulated electronic packages are secured on the tray by applying pressure across an x-direction and a y-direction.

7. A method for forming a conformal electromagnetic interference shield on at least one singulated electronic package, comprising the steps of:
   preparing a tray by mounting an electromagnetic interference tape onto a frame formed with a hole;
   placing singulated electronic packages on the tray, in which the singulated electronic packages are placed within the frame on the electromagnetic interference tape;
   supporting the tray using a jig, the jig having an outwardly extending arcuate top surface on which the tray with the singulated electronic packages is received, and a plurality of magnets, wherein the top surface is a raised paraboloid; and forming the conformal electromagnetic interference shield onto the singulated electronic packages on the tray through a sputtering process;

wherein the electromagnetic interference tape includes one thermal conductor layer;

wherein each of the singulated electronic packages includes a pre-tape layer that includes one thermal conductor layer;

wherein the singulated electronic packages are placed on the electromagnetic interference tape such that the pre-tape layer of each singulated electronic package is adjacent to the electromagnetic interference tape;

wherein the magnets of the jig are each located adjacently with respect to sides of the jig but absent underneath the arcuate surface of the jig; and wherein the frame of the tray is attracted to the magnets of the jig in which the frame is secured to the magnets in a vertically adjacent manner, while doing so, the electromagnetic interference tape conforms to the arcuate surface of the jig in a taut manner, for continuous contact between the jig and the singulated electronic packages on the tray, so that heat is dissipated from the singulated electronic packages to the jig during the sputtering process through the thermal conductor layers of the electromagnetic interference tape and the singulated electronic packages.

8. The method according to claim 7, further comprising the step of securing the singulated electronic packages on the tray by applying pressure across the x-direction and the y-direction, using a pressure roller module.

9. The method according to claim 7, further comprising the step of detaching the singulated electronic packages from the tray after the completion of the sputtering process.

* * * * *